US012663442B2

(12) United States Patent (10) Patent No.: US 12,663,442 B2
Lim (45) Date of Patent: Jun. 23, 2026

(54) CURRENT MEASURING DEVICE

(71) Applicant: LS ELECTRIC CO., LTD., Anyang-si (KR)

(72) Inventor: Jeong Woo Lim, Anyang-si (KR)

(73) Assignee: L'S ELECTRIC CO., LTD., Anyang-si (KR)

( * ) Notice: Subject to any disclaimer, the term of this patent is extended or adjusted under 35 U.S.C. 154(b) by 320 days.

(21) Appl. No.: 18/282,935

(22) PCT Filed: Mar. 14, 2022

(86) PCT No.: PCT/KR2022/003542
§ 371 (c)(1),
(2) Date: Apr. 15, 2024

(87) PCT Pub. No.: WO2022/225186
PCT Pub. Date: Oct. 27, 2022

(65) Prior Publication Data
US 2024/0255547 A1 Aug. 1, 2024

(30) Foreign Application Priority Data
Apr. 23, 2021 (KR) ........................ 10-2021-0052982

(51) Int. Cl.
*G01R 1/06* (2006.01)
*G01R 15/14* (2006.01)
(52) U.S. Cl.
CPC .................................. *G01R 15/146* (2013.01)

(58) Field of Classification Search
CPC ........ G01R 19/165; G01R 1/20; G01R 13/02; G01R 15/146; G01R 35/00
See application file for complete search history.

(56) References Cited

U.S. PATENT DOCUMENTS

| | | | | |
|---|---|---|---|---|
| 6,489,786 B1 * | 12/2002 | Takemoto | ........ | G01R 19/16542 |
| | | | | 324/120 |
| 6,597,137 B1 * | 7/2003 | Griepentrog | .............. | B61L 3/20 |
| | | | | 246/219 |
| 11,183,843 B1 * | 11/2021 | Cooper | ................... | H02J 3/322 |
| 2011/0234199 A1 * | 9/2011 | Baert | ................... | H01H 47/002 |
| | | | | 324/72 |

(Continued)

FOREIGN PATENT DOCUMENTS

| | | |
|---|---|---|
| CN | 104158401 A | 11/2014 |
| CN | 208636391 U | 3/2019 |

(Continued)

OTHER PUBLICATIONS

International Search Report for related International Application No. PCT/KR2022/003542; action dated Oct. 27, 2022; (2 pages).

(Continued)

*Primary Examiner* — Thang X Le
(74) *Attorney, Agent, or Firm* — K&L Gates LLP

(57) ABSTRACT
The present disclosure relates to a current measuring device comprising: a plurality of unit modules which are provided with mutually different grounds and are connected in series; a power unit which supplies high-voltage DC or AC power to the plurality of unit modules via a line; and a current sensor which measures a current flowing through the line.

4 Claims, 5 Drawing Sheets

(56)                    References Cited

U.S. PATENT DOCUMENTS

2013/0128396 A1*   5/2013  Danesh ................. G01R 23/02
                                                           361/45
2013/0307556 A1*  11/2013  Ledenev ................ H02S 50/10
                                                           324/509
2014/0191772 A1     7/2014  Hetzler

FOREIGN PATENT DOCUMENTS

CN        112218772  A       1/2021
JP          5391420          10/2013
JP          5793021           8/2015
JP        2016164490 A        9/2016
JP          6305184           3/2018
KR       20130137389 A       12/2013
KR        101584253 B1        1/2016

OTHER PUBLICATIONS

Written Opinion for related International Application No. PCT/
KR2022/003542; action dated Oct. 27, 2022; (3 pages).
Notice of Allowance for related Korean Application No. 10-2021-
0052982; action dated Dec. 7, 2023; (6 pages).
Office Action for related Chinese Application No. 20228000949.0;
action dated Mar. 28, 2026; (7 pages).

* cited by examiner

CURRENT MEASURING DEVICE

CROSS-REFERENCE TO RELATED APPLICATION

This application is a National Stage of International Application No. PCT/KR2022/003542, filed on Mar. 14, 2022, which claims priority to and the benefit of Korean Patent Application No. 10-2021-0052982, filed on Apr. 23, 2021, the disclosure of which is incorporated herein by reference in its entirety.

FIELD

The present disclosure relates to a current measuring device, and more specifically to a current measuring device which is capable of measuring a current value by using a low-voltage current sensor in a system through which a high-voltage direct current or alternating current flows.

BACKGROUND

The content described in this section merely provides background information for the present exemplary embodiment and does not constitute the related art.

In general, there are various methods for measuring the magnitude of a current, but the most commonly used measurement method is a method of using a current sensor to which a core and Hall elements are applied or a current sensor to which a shunt resistor is applied.

The current sensor to which a core and Hall elements are applied generates a magnetic field around the line in proportion to the amount of an input current flowing through the line or bus bar, and it is a method of calculating the magnitude of an input current by measuring the output voltage generated by the magnetic field by using the Hall elements.

However, since the strength of the magnetic field that can be accommodated according to the inherent material properties of each core, that is, the limit value is set, when the limit value is reached and the saturation state is reached, there is a problem in that it cannot be measured even if the amount of input current increases.

The current sensor to which a shunt resistor is applied measures a current flowing through the resistor by measuring the voltage across both ends of the resistor based on Ohm's law.

However, since the current flows directly through the current sensor to which a shunt resistor is applied, Joule heat (Joule heat=I2R) is generated by the flowing current, which makes it difficult to be used in a device through which a large current flows. In order to reduce the Joule heat, the resistance value must be lowered to the level of several to tens of microohms ($\mu\Omega$), and in this case, since signals that can be sensed also become smaller together, there is a problem in that measurement is impossible or errors increase.

In addition, both ends of the current sensor to which a shunt resistor is applied must be connected to a measurement circuit, and if a high-voltage power grid voltage is directly connected to the measurement circuit, there is a risk of electric shock, and if it is connected without circuit insulation, there is also a problem in that it may result in shunts (short circuits).

Therefore, a preferred method for measuring the value of a current flowing in the line is to use a current sensor that meets the standards of a current flowing in the line.

That is, in order to measure the current value of a line through which a high-voltage direct current or alternating current flows, it must be measured with a high-voltage current sensor.

FIG. 1 schematically shows the configuration of a current measuring device for measuring a current value by using a conventional high-voltage current sensor.

Referring to FIG. 1, the conventional current measuring device includes a power supply unit 10, a current sensor 20 and a plurality of unit modules.

Herein, the plurality of unit modules are provided with different grounds and are connected in series, and the power supply unit 10 supplies high voltage DC or AC power to the plurality of unit modules through lines.

In this case, the current sensor 20 is a high-voltage current sensor, and it can measure a current value flowing through the line by receiving an individual ground (GND).

Herein, since the current sensor 20 is driven by receiving an individual ground (GND), the insulation voltage applied between the current sensor 20 and the line becomes the same as the voltage of the power supply unit 10.

However, the high-voltage current sensor has a problem in that the sensing sensitivity is inferior to that of the low-voltage current sensor, because it requires an additional insulation design for the line and the use of an insulating device.

Another method is to increase the insulation voltage of a low-voltage current sensor to manufacture and measure a new current sensor, but this consumes a lot of money and the manufacturing method is also very difficult.

Accordingly, the situation is that it is necessary to introduce a current measuring device that can measure a current by minimizing the insulation voltage between the line through which a high-voltage current flows and the low-voltage current sensor by using a low-voltage current sensor without a special insulation design or insulation device.

SUMMARY

Accordingly, in order to solve the problems of the related art, an object of the present disclosure is to provide a device for measuring a current value of a line through which a high-voltage current flows by using only a low-voltage commercial current sensor without using an additional insulation design and insulation device.

The objects of the present disclosure are not limited to the above-mentioned matter, and other objects that are not mentioned will be clearly understood by those of ordinary skill in the art from the following description.

In order to achieve the above objects, the current measuring device according to the present disclosure may include a plurality of unit modules which are provided with mutually different grounds and are connected in series; a power unit which supplies high-voltage DC or AC power to the plurality of unit modules via a line; and a current sensor which measures a current flowing through the line, wherein the current sensor is provided with a ground from an adjacent unit module that is closest to the current sensor among the plurality of unit modules.

In an exemplary embodiment of the present disclosure, the insulation voltage of the current sensor may be the same as a voltage applied between the adjacent unit module and the unit module that is closest to the adjacent unit module.

In an exemplary embodiment of the present disclosure, the current sensor may measure a current value in a non-contact manner in which the current sensor is hooked to the line in a ring shape.

In an exemplary embodiment of the present disclosure, the current sensor may be a low-voltage current sensor.

In an exemplary embodiment of the present disclosure, the current sensor may measure a current value by selectively using one or two current sensors according to a current flowing in the line.

In an exemplary embodiment of the present disclosure, the current measuring device may further include a control unit for controlling the current sensor by determining an operating state of the current sensor based on a current value measured by the current sensor; a display unit for displaying the current value measured by the current sensor; an external device for allowing a manager to monitor the operating state determined by the control unit; and communication unit for connecting the control unit and the external device.

In the present disclosure, since the insulation voltage between the line and the current sensor can be minimized without a special insulation design and insulation device on the line through which a high voltage current flows, the current value can be measured with a low-voltage current sensor.

In addition, the present disclosure can minimize the structure and implementation cost of a device, and can provide higher measurement performance than measurement with a high-voltage current sensor.

Even if the effects are not explicitly mentioned herein, the effects described in the following specification expected by the technical features of the present disclosure and their provisional effects are treated as described in the specification of the present disclosure.

DETAILED DESCRIPTION

Figure 1:
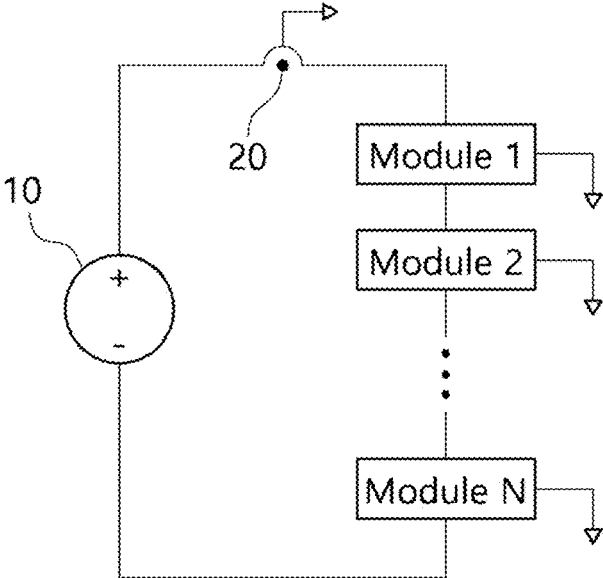
FIG. 1 is a block diagram showing the configuration of a conventional current measuring device.

In order to fully understand the present disclosure, the operational advantages of the present disclosure and the objects achieved by the practice of the present disclosure, reference must be made to the accompanying drawings illustrating preferred exemplary embodiments of the present disclosure and the contents described in the accompanying drawings.

Hereinafter, the present disclosure will be described in detail by describing preferred exemplary embodiments of the present disclosure with reference to the accompanying drawings. However, the present disclosure may be embodied in several different forms, and is not limited to the described exemplary embodiments. Further, in order to clearly describe the present disclosure, parts that are irrelevant to the description are omitted, and the same reference numerals in the drawings indicate the same members.

Throughout the specification, when a part "includes" a certain component, it does not exclude other components unless otherwise stated, but may further include other components. In addition, terms such as " . . . unit", " . . . part", "module" and "block" described in the specification mean a unit that processes at least one function or operation, and it may be implemented as hardware, software or a combination of hardware and software.

Hereinafter, an exemplary embodiment of the present disclosure will be described in detail with reference to the accompanying drawings. Further, in terms of describing the present disclosure, when it is determined that the detailed description of a related known configuration or function may obscure the gist of the present disclosure, the detailed description thereof may be omitted.

Hereinafter, the configuration of the current measuring device according to an exemplary embodiment of the present disclosure will be described in detail with reference to the related drawings.

Figure 2:
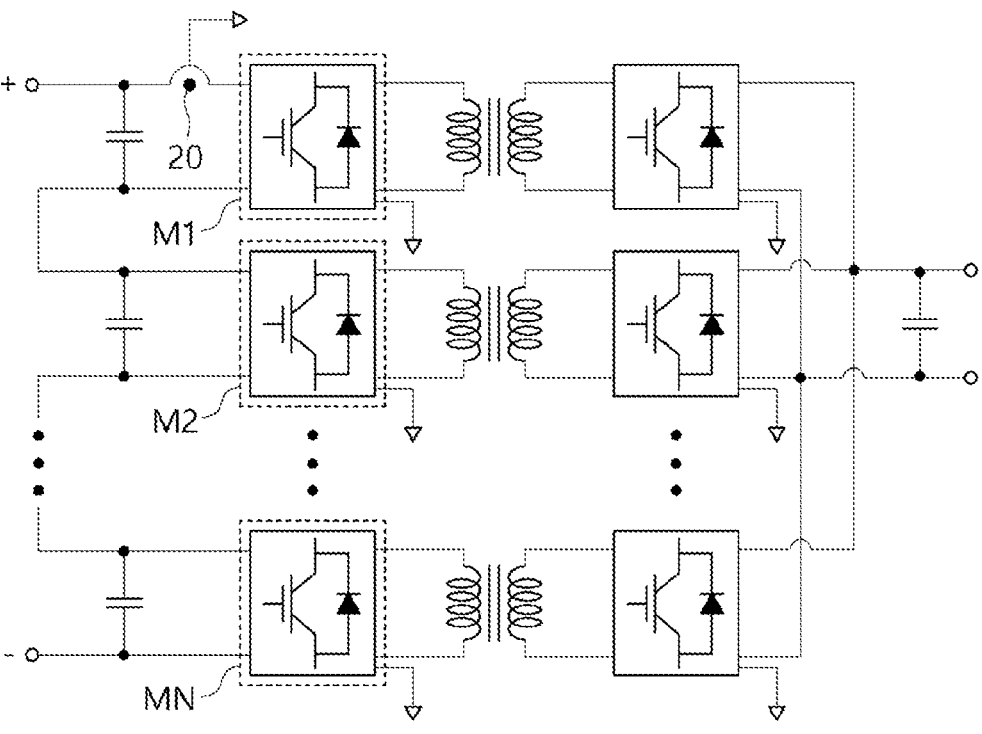
FIG. 2 is a detailed configuration diagram of an SST that is applied to a general high voltage DC power distribution system.
Figure 3:
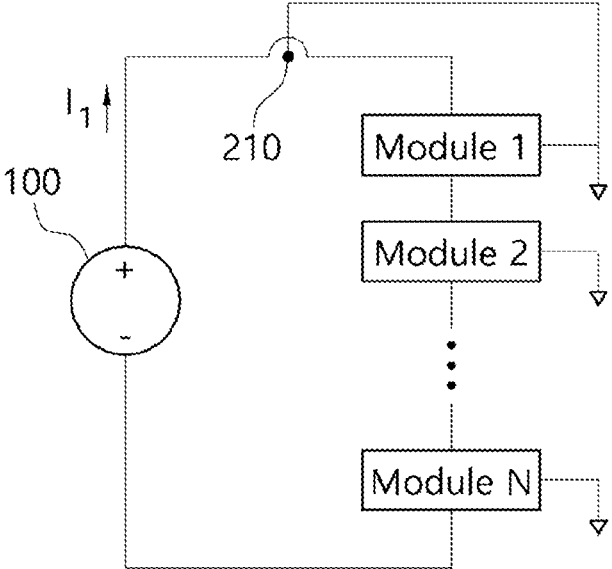
FIG. 3 is a configuration diagram showing the configuration of a current measuring device for measuring a current value of a line through which a high-voltage direct current flows according to an exemplary embodiment of the present disclosure.
Figure 4:
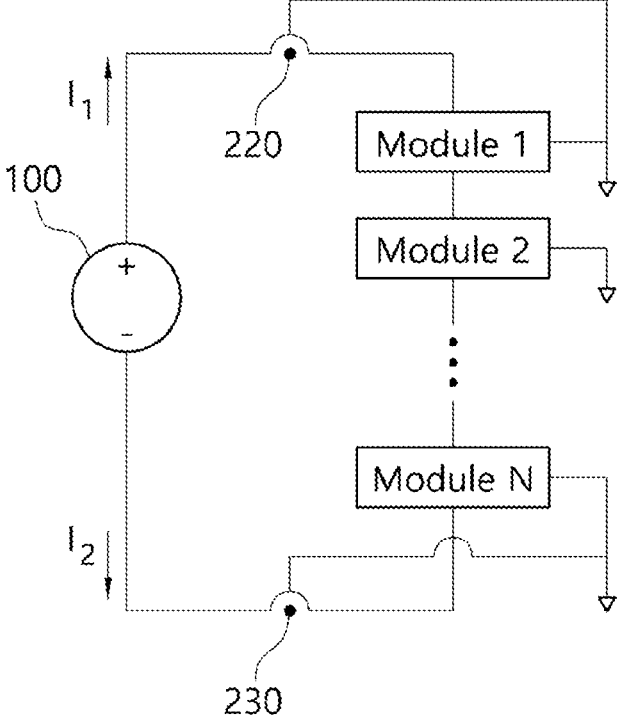
FIG. 4 is a configuration diagram showing the configuration of a current measuring device for measuring a current value of a line through which a high-voltage alternating current flows according to an exemplary embodiment of the present disclosure.
Figure 5:
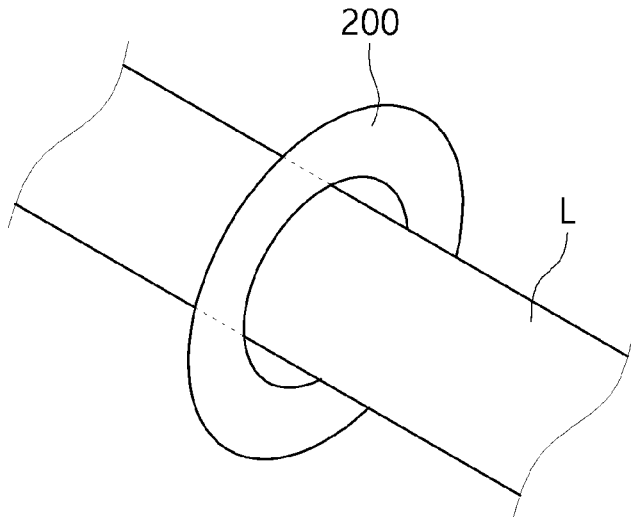
FIG. 5 is a diagram illustrating the current sensor of a current measuring device according to an exemplary embodiment of the present disclosure.

FIG. 2 is a detailed configuration diagram of an SST that is applied to a general high voltage DC power distribution system, FIG. 3 is a configuration diagram showing the configuration of a current measuring device for measuring a current value of a line through which a high-voltage direct current flows according to an exemplary embodiment of the present disclosure, FIG. 4 is a configuration diagram showing the configuration of a current measuring device for measuring a current value of a line through which a high-voltage alternating current flows according to an exemplary embodiment of the present disclosure, and FIG. 5 is a diagram illustrating the current sensor of a current measuring device according to an exemplary embodiment of the present disclosure.

With reference to FIG. 2, the configuration of a general solid state transformer (SST) will be described. The SST is a core component of a power converter that is applied to a high voltage MVDC (Medium Voltage Direct Current) distribution system, and the input and output of the converter are electrically separated, and the active control of bidirectional power transmission is possible.

In the MVDC distribution system, the SST has a three-step power conversion structure and may be classified into non-modular, semi-modular and modular types. FIG. 2 is a modular SST, and it may include N unit modules (M1, M2, . . . , MN (where N is an integer of 3 or more)) and corresponding capacitors and transformers. Herein, each of the N unit modules may be connected in series, and the unit module may be a semiconductor switch for power. In an exemplary embodiment, it may correspond to an insulated gate bipolar transistor (IGBT) or a thyristor.

In such a modular SST, in order to measure a current value, a high-voltage current sensor 20 having a separate ground (GND) must be used. However, this entails an additional insulation design and the use of insulation devices for the line, and has a problem in that the sensing sensitivity is also inferior to that of the low-voltage current sensor.

The present disclosure has been devised to solve such a problem, and it is directed to providing a current measuring device which is capable of measuring the current value of a line through which a high-voltage current flows by using only a low-voltage commercial current sensor without using an additional insulation design and insulation device.

Referring to FIGS. 3 and 4, in the current measuring device according to an exemplary embodiment of the present disclosure, a plurality of unit modules (module 1, module 2, . . . , module N (where N is an integer of 3 or more)) have different grounds (GND_1, GND_2, . . . , GND_N (where N is an integer of 3 or more)) from each other, and a current value may be measured by using a low-voltage current sensor on a circuit through which a high-voltage current that is electrically connected in series flows.

The power supply unit 100 according to an exemplary embodiment of the present disclosure supplies power so as to operate a plurality of unit modules.

In this case, the power supply unit 100 may supply a high-voltage DC or AC power, and the current may flow in the $I_1$ or $I_2$ direction.

For example, if the power supply unit 100 supplies DC power, the current flows constantly in the $I_1$ direction to supply power, and if the power supply unit 100 supplies AC power, the current flows may periodically change in the $I_1$ or $I_2$ direction so as to supply power.

The voltage output from the power supply unit 100 is a high voltage, and for example, direct current may exceed 1,500V, and alternating current may exceed 1,000V.

In the present disclosure, a plurality of unit modules are serially connected to each other in a multi-stage form, and may receive an alternating current (direction and amplitude magnitude change with all time) or a direct current (both of amplitude magnitude and direction do not change with time) from the power supply unit 100.

An exemplary embodiment of the present disclosure does not specifically limit the type of the unit module.

For example, the plurality of unit modules may be a battery including a plurality of unit battery cells that are connected in series with each other, or may be a battery in which batteries including unit battery cells are connected in series with each other.

In addition, assuming that the impedance of the plurality of unit modules is the same, since the plurality of unit modules are connected in series with each other, each unit module receives a divided voltage having a magnitude in which the voltage supplied from the power supply unit 100 is divided by the number of unit modules.

The current sensor 200 according to an exemplary embodiment of the present disclosure may be a low-voltage current sensor which is capable of detecting an alternating current or a direct current and measuring a current value flowing in a line, but the type and method are not limited thereto.

In addition, the current sensor 200 may be used at the rated insulation voltage or less, and it may accurately measure a current value when detecting the current that is less than the rated current.

Therefore, in the current sensor 200 of the current measuring device of the present disclosure, in order to lower the insulation voltage between the current sensor 200 and the line to which the current sensor 200 is fastened, the current sensor 200 may be connected to the ground of the module that is closest to the current sensor 200 among a plurality of unit modules that are connected in series in a multi-stage form.

The current sensor 200 of the present disclosure may include a first current sensor 210 when the power source 100 supplies a direct current, and a second current sensor 220 and a third current sensor 230 when the power source 100 supplies an alternating current.

Referring to FIG. 3, the first current sensor 210 may measure a current value flowing through the line, when a high-voltage direct current from the power supply unit 100 flows in the $I_1$ direction through the line.

Specifically, the first current sensor 210 is fastened to the line where the power supply unit 100 and the module 1 are connected, and receives GND_1, which is the ground of the module 1 closest to the first current sensor 210, so as to measure the current value flowing through the line.

Referring to FIG. 4, the second current sensor 220 and the third current sensor 230 may measure a current value flowing through the line when a high-voltage alternating current flows in the $I_1$ or $I_2$ direction through the line.

Specifically, the second current sensor 220 is fastened to the line where the power supply unit 100 and module 1 are connected, and receives GND_1, which is the ground of module 1 that is closest to the second current sensor 220, so as to measure the current value flowing through the line.

In addition, the third current sensor 230 is coupled to the line where the module N and the power supply unit 100 are connected, and receives GND_N, which is the ground of module N that is closest to the third current sensor 230, so as to measure the current value flowing through the line.

That is, after the current sensor 200 is fastened to the line, the current sensor 200 and the closest module receive the ground such that the insulation voltage between the current sensor 200 and the line is the same as the voltage applied to the adjacent module.

For this reason, the current sensor 200 may measure the current value flowing through the line by using the low-voltage current sensor without breakdown of insulation due to the high voltage of the power supply unit 100.

Referring to FIG. 5, the current sensor 200 may have a ring shape that surrounds a line L through which a high-voltage current flows so as to measure the current while the line L through which the high-voltage current flows is spaced apart by a predetermined distance.

The shape of the current sensor 200 is not limited thereto, and it may have a hook shape with one side open to position the line L, through which a high-voltage current flows into the current sensor 200, inside or to separate to the outside.

Although not illustrated in the drawings, one side of the current sensor 200 may be fixedly installed so as not to contact the line by a fixing means such as a fixing screw such that the current sensor 200 can maintain a state of being spaced apart from the line L, through which a high-voltage current flows, by a predetermined distance.

A coil for measuring a current may be accommodated in the current sensor 200, and it may be filled with a filler or the like in a state where the coil is provided.

The coil of the current sensor 200 may be manufactured in a three-dimensional structure by winding a wire in a spiral shape, but the shape of the coil accommodated therein is not limited thereto.

When the current sensor 200 is in a live state through which electricity flows in the line, a voltage is induced in the coil that is accommodated therein such that the current flows, and through this, the current of the line may be measured.

Figure 6:
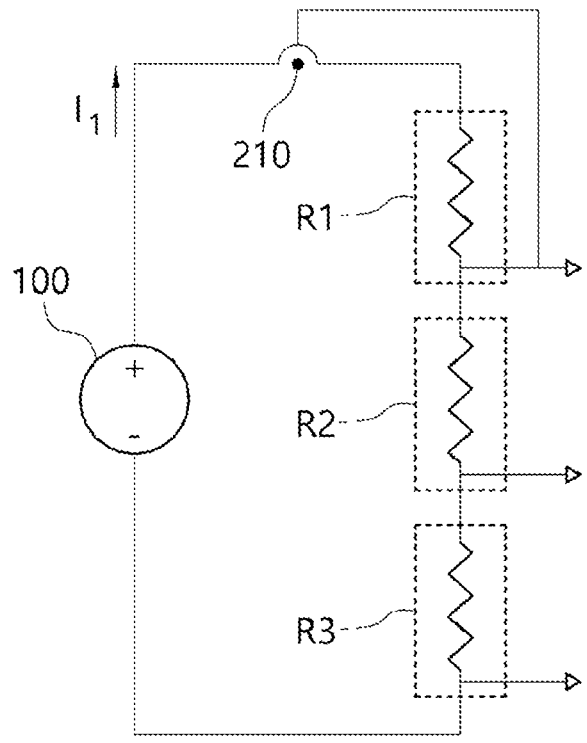
FIG. 6 is a diagram for describing the method for measuring a current value by using a current measuring device according to an exemplary embodiment of the present disclosure.

FIG. 6 is a diagram for describing the method for measuring a current value by using a current measuring device according to an exemplary embodiment of the present disclosure.

Referring to FIG. 6, a high-voltage DC power flows in the $I_1$ direction from the power supply unit 100, and each resistor has an individual ground and may be connected in series in a multi-stage form.

If a voltage of 1,500V is applied from the power supply unit 100 and three resistors R1, R2, R3 having the same resistance value are connected in series in a multi-stage form, a divided voltage of 500V may be applied to each resistor.

That is, at R1, 1,500V may be input and 1,000V may be withdrawn, and at R2, 1,000V may be inputted and 500V may be withdrawn. In addition, at the last R3, 500V may be input, and 0V may be withdrawn.

Herein, in order to measure the high-voltage current applied from the power supply unit 100, the first current sensor 210 may be fastened to the line connected to the power supply unit 100 and R1, and the ground of the first current sensor 210 may be connected to GND_1, which is the ground of R1 that is closest to the first current sensor 210.

For this reason, the insulation voltage between the first current sensor 210 and the line becomes 500V, which is the voltage applied to R1.

That is, the differential voltage between the line to which the first current sensor 210 is fastened and the ground of the first current sensor 210 has the smallest value than when it is connected to the ground of a resistor other than R1.

Accordingly, the first current sensor 210 may measure the current value without breakdown of insulation due to the high voltage of the power supply unit 100 by using the low-voltage current sensor.

Figure 7:
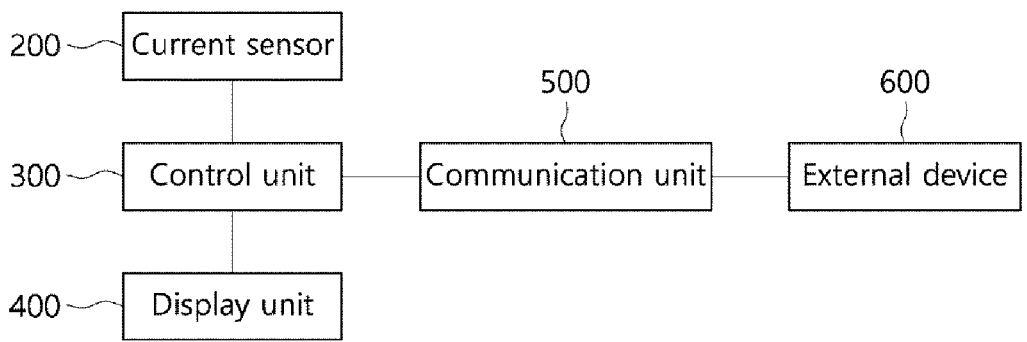
FIG. 7 is a diagram illustrating a block diagram of the current measuring device according to an exemplary embodiment of the present disclosure.

FIG. 7 is a diagram illustrating a block diagram of the current measuring device according to an exemplary embodiment of the present disclosure.

Referring to FIG. 7, the current measuring device of the present disclosure may further include a control unit 300, a display unit 400, a communication unit 500 and an external device 600.

The control unit 300 may be electrically connected to the current sensor 200 to control the current sensor 200 by determining an accident or failure based on a current value measured from the current sensor 200.

Specifically, by comparing the current value measured by the current sensor 200 with the reference current value, it is possible to determine whether the amount of current flowing in the current measurement line is less than the rated current or whether it is an accident current such as an overcurrent or a short-circuit current.

If the control unit 300 detects an overcurrent or a short-circuit current and determines that the current sensor 200 is in an abnormal operating state, it may be displayed through the display unit 400 or a signal indicating that the current sensor 200 is in an abnormal operating state may be transmitted to the external device 600 through the communication unit 500.

Herein, the display unit 400 may be made of a small LCD window or the like, and the operating state of the current sensor 200 or the measured current value may be displayed in numbers or characters to inform the manager.

The external device 600 may be a computing device, a wearable device or the like, in which the manager can monitor the states of the power supply unit 100, the current sensor 200 and a plurality of modules.

The communication unit 500 may transmit/receive various data and signals to/from an external device. The communication unit 500 may be connected to the control unit 300 and transmit a current sensor 200 diagnosis signal instructing the diagnosis of the current sensor 200 received from the external device 600 to the control unit 300. In addition, when the control unit 300 determines that the current sensor 200 is in an abnormal operating state in the diagnostic mode, the communication unit 500 may receive a command for generating an abnormal operation signal of the current sensor 200 from the control unit 300. The communication unit 500 that has received the command for generating an abnormal operation signal of the current sensor 200 from the control unit 300 may transmit an abnormal operation signal of the current sensor 200 to an external device.

As described above, in the present disclosure, in a system in which a plurality of unit modules are connected in series and a high-voltage current flows, the ground of the current sensor that is fastened to the line without a special insulation design and insulation device on the line is connected to the unit module that is closest to the current sensor, and thus, since the insulation voltage between the line and the current sensor can be minimized, the current value may be measured with a low-voltage current sensor.

Furthermore, the present disclosure may provide higher measurement performance than measurement with a high-voltage current sensor while minimizing the structure and implementation cost of the device.

The above description is merely illustrative of the technical idea of the present disclosure, and various modifications, changes and substitutions will be possible within the scope that does not depart from the essential characteristics of the present disclosure by those of ordinary skill in the art to which the present disclosure pertains. Accordingly, the exemplary embodiments disclosed in the present disclosure and the accompanying drawings are for describing, not limiting, the technical spirit of the present disclosure, and the scope of the technical spirit of the present disclosure is not limited by these exemplary embodiments and the accompanying drawings. The protection scope of the present disclosure should be interpreted by the following claims, and all technical ideas within the scope equivalent thereto should be construed as being included in the scope of the present disclosure.

In the current measuring device of the present disclosure, the power supply module may be used in various industrial fields, such as power systems for supplying power to various industrial devices and the like.

What is claimed is:

1. A current measuring device, comprising:
   a plurality of unit modules which are provided with mutually different grounds and are connected in series;
   a power unit which supplies high-voltage DC or AC power to the plurality of unit modules via a line; and
   a current sensor which measures a current flowing through the line,
   wherein the current sensor is provided with a ground from an adjacent unit module that is closest to the current sensor among the plurality of unit modules such that a voltage difference between a measurement point and a ground terminal of the current sensor is equivalent to a voltage drop across the adjacent unit module.
2. The current measuring device of claim 1, wherein the current sensor is a low-voltage current sensor.

3. The current measuring device of claim 1, wherein the current sensor measures a current value by selectively using one or two current sensors according to the current flowing in the line.

4. The current measuring device of claim 1, further comprising:

a control unit for controlling the current sensor by determining an operating state of the current sensor based on a current value measured by the current sensor;

a display unit for displaying the current value measured by the current sensor;

an external device for allowing a manager to monitor the operating state determined by the control unit; and communication unit for connecting the control unit and the external device.

* * * * *